United States Patent
Hung et al.

(10) Patent No.: US 10,777,591 B2
(45) Date of Patent: Sep. 15, 2020

(54) IMAGE SENSOR DEVICE

(71) Applicant: Taiwan Semiconductor Manufacturing Co., Ltd., Hsin-Chu (TW)

(72) Inventors: Chen-Hsiang Hung, Kaohsiung (TW); Chung-Chuan Tseng, Hsinchu (TW); Li-Hsin Chu, New Taipei (TW); Chia-Ping Lai, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/882,894

(22) Filed: Jan. 29, 2018

(65) Prior Publication Data

US 2019/0057991 A1    Feb. 21, 2019

Related U.S. Application Data

(60) Provisional application No. 62/545,677, filed on Aug. 15, 2017.

(51) Int. Cl.
*H01L 27/146*    (2006.01)

(52) U.S. Cl.
CPC .... *H01L 27/14614* (2013.01); *H01L 27/1463* (2013.01); *H01L 27/14689* (2013.01); *H01L 27/14643* (2013.01)

(58) Field of Classification Search
CPC ......... H01L 27/14689; H01L 27/14614; H01L 27/14643; H01L 27/14612; H01L 27/1463
See application file for complete search history.

(56) References Cited

U.S. PATENT DOCUMENTS

| | | | |
|---|---|---|---|
| 9,281,331 B2 * | 3/2016 | Chen | H01L 27/14614 |
| 2008/0029796 A1 * | 2/2008 | Mori | H01L 27/1463 257/292 |
| 2009/0303371 A1 | 12/2009 | Watanabe et al. | |
| 2013/0234244 A1 | 9/2013 | Liu et al. | |

FOREIGN PATENT DOCUMENTS

| | | |
|---|---|---|
| CN | 101609837 A | 12/2009 |
| KR | 1020090127828 A | 12/2009 |
| KR | 1020130103272 A | 9/2013 |
| TW | 201327793 A | 7/2013 |
| TW | 201507122 A | 2/2015 |

OTHER PUBLICATIONS

Official Action dated Mar. 25, 2019, in corresponding Taiwan Patent Application No. 10820257310.

* cited by examiner

*Primary Examiner* — Jasmine J Clark
(74) *Attorney, Agent, or Firm* — Duane Morris LLP

(57) ABSTRACT

A semiconductor device includes: a photodiode formed in a substrate; and at least one transistor having a gate feature that comprises a first portion and a second portion coupled to an end of the first portion, the first portion disposed above and extending along a major surface of the substrate and the second portion extending from the major surface of the substrate into the substrate, wherein the photodiode and the at least one transistor at least partially form a pixel.

21 Claims, 7 Drawing Sheets

IMAGE SENSOR DEVICE

CROSS-REFERENCE TO RELATED APPLICATION

The present application claims priority to U.S. Provisional Patent Application No. 62/545,677, filed on Aug. 15, 2017, which is incorporated by reference herein in its entirety.

BACKGROUND

Integrated circuit (IC) technologies are constantly being improved. Such improvements frequently involve scaling down device geometries to achieve lower fabrication cost, a higher device integration density, a higher speed, and better performance. Along with various advantages resulting from such a reducing geometry size, improvements are being made directly to IC devices, for example, an image sensor device.

Generally, an image sensor device includes an array (or grid) of pixels for detecting incident light and recording intensity (or brightness) of the incident light. Each pixel includes at least one photosensitive diode (hereinafter "photodiode") configured to detect the incident light and convert the detected incident light into an electrical signal (e.g., a photocurrent/current signal), and a plurality of transistors (hereinafter "pixel transistors") coupled to the photodiode that are collectively configured to process the electric signal(s) so as to record the intensity or brightness of the detected incident light.

To assess performance of the image sensor device, various characteristics of the image sensor device are generally considered, an important one of which is a quantum efficiency of the image sensor device. Such a quantum efficiency is typically determined by a "fill factor" of the image sensor device. The fill factor is calculated as a ratio of a chip area occupied by the photodiode(s) divided by a total chip area of the respective pixel. In conventional image sensor devices, however, at least one of the above-mentioned pixel transistors are planarly formed. That is, a respective gate feature of the at least one pixel transistor only laterally extends along a major surface of the pixel. When forming the gate feature in such a completely lateral fashion, the fill factor may be disadvantageously reduced since over a given chip area, a chip area available for disposing the photodiodes may be significantly reduced.

Thus, existing image sensor devices and methods to make the same are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
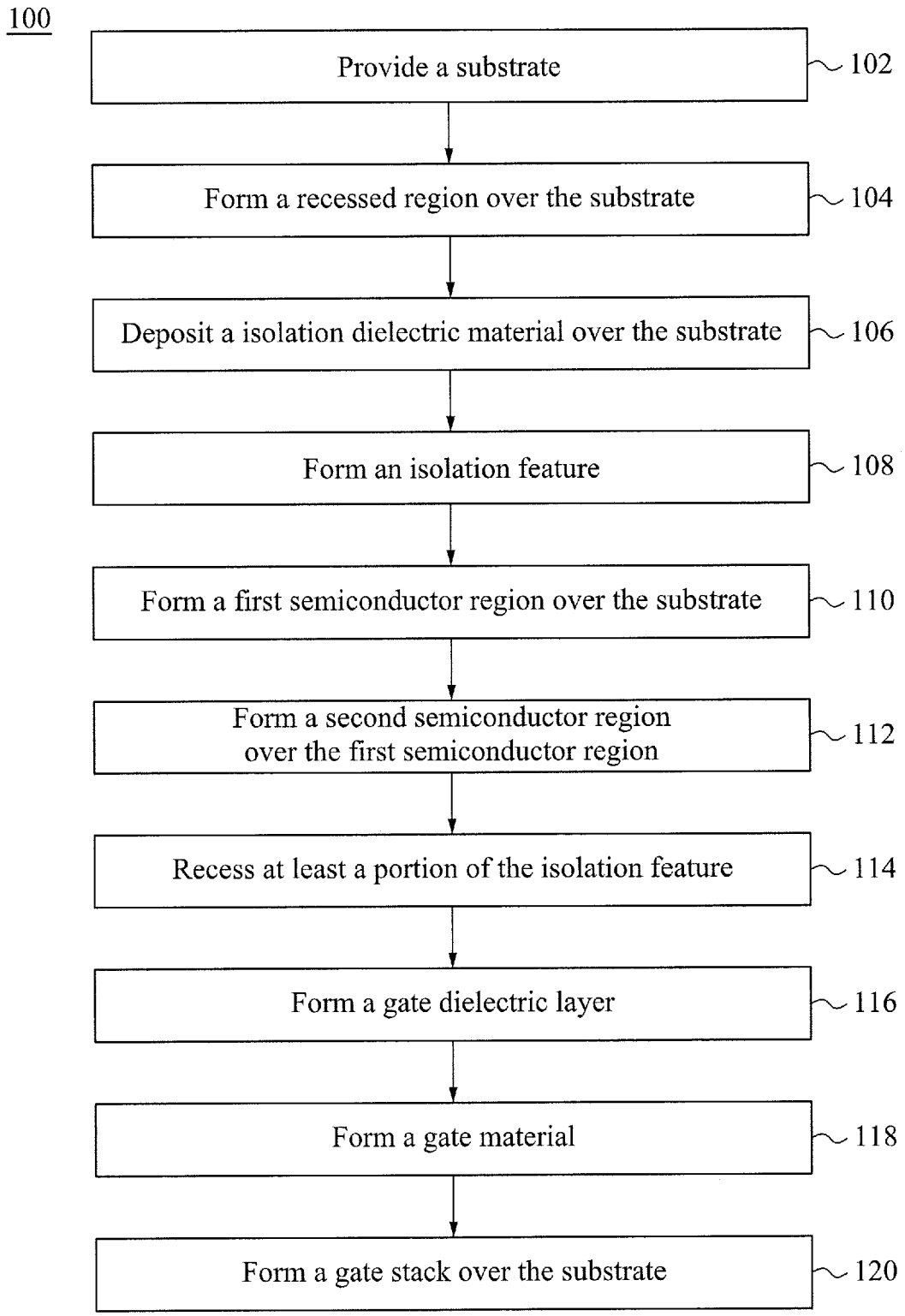
FIG. 1 illustrates a flow chart of an exemplary method for forming a semiconductor device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of an image sensor device and methods to form the same. In some embodiments, the disclosed image sensor device includes a plurality of pixels formed on a semiconductor substrate, each of which includes at least one photodiode formed in the semiconductor substrate and at least one pixel transistor that has a respective gate feature, at least partially, extending into the semiconductor substrate. By forming at least one pixel transistor in each of the plurality of pixels in such a fashion, a corresponding fill factor of the disclosed image sensor device may be significantly increased since a lateral distance by which the pixel transistor extends may be reduced, which allows more photodiodes to be disposed over a given chip area. As such, performance (e.g., the quantum efficiency) of the disclosed image sensor device can be significantly improved over the exiting image sensor devices while remaining the area where the disclosed image sensor device is formed unchanged.

FIG. 1 illustrates a flowchart of a method 100 to form a semiconductor device according to one or more embodiments of the present disclosure. It is noted that the method 100 is merely an example, and is not intended to limit the present disclosure. In some embodiments, the semiconductor device is, at least part of, an image sensor device. As employed by the present disclosure, the image sensor device refers to any device that can detect an optical signal (e.g., photons), convert it into an electrical signal, and process the electrical signal. For example, the image sensor device may be a complementary metal-oxide-semiconductor (CMOS) image sensor (CIS) device, an active pixel sensor device, a charge coupled device (CCD), or a passive pixel sensor device. It is noted that the method 100 of FIG. 1 does not produce a completed image sensor device. A completed image sensor device may be fabricated using complementary metal-oxide-semiconductor (CMOS) technology processing. Accordingly, it is understood that additional operations may be provided before, during, and after the method 100 of FIG. 1, and that some other operations may only be briefly described herein.

In some embodiments, the method 100 starts with operation 102 in which a substrate is provided. In some embodiments, the substrate is intrinsically or extrinsically doped with a first doping type (e.g., p-type). The method 100 continues to operation 104 in which a recessed region is formed over the substrate. In some embodiments, the recessed region, formed as a ring-like structure, extends into the substrate from its front surface. The method 100 continues to operation 106 in which an isolation dielectric material is deposited over the substrate. In some embodiments, the isolation dielectric material overlays the front surface of the substrate, and, accordingly, fills the recessed region. The method 100 continues to operation 108 in which an isolation feature is formed. In some embodiments, the isolation feature is formed by performing a polishing process (e.g., a chemical mechanical polishing (CMP) process) on the isolation dielectric material until the front surface of the substrate is re-exposed. As such, the isolation feature may follow the profile of the recessed region (e.g., the ring-like structure). In other words, the isolation feature defines (e.g., surrounds) an active region where at least a pixel is to be formed. The method 190 continues to operation 110 in which a first semiconductor region is formed over the substrate. In some embodiments, the first semiconductor region is doped a second doping type opposite to the first doing type (e.g., n-type). And, the first semiconductor region is laterally surrounded by the isolation feature (i.e., within the above-mentioned active region) and inwardly extends into the substrate with a first depth. The method 100 continues to operation 112 in which a second semiconductor region is formed over the first semiconductor region. In some embodiments, the second is doped the first doping type (e.g., p-type). And, the second semiconductor region inwardly extends into the substrate (or the first semiconductor region) with a second depth that is shallower than the first depth. As such, a junction in communication with two different doping types (two different conductive types) may be formed in the substrate and surrounded by the isolation feature.

Next, the method 100 continues to operation 114 in which at least a portion of the isolation feature is recessed. In some embodiments, after the at least a portion of the isolation feature is recessed, part of the recessed region (formed in operation 104), which was filled by the isolation dielectric material, may be re-exposed. The method 100 continues to operation 116 in which a gate dielectric layer is formed. In some embodiments, the gate dielectric layer is formed over the front surface of the substrate, which accordingly lines the recessed portion of the isolation feature. The method 100 continues to operation 118 in which a gate material is formed over the gate dielectric layer. Such a gate material may include a polysilicon material, for example. In some embodiments, since the gate material layer (formed in operation 116) is substantially thin, a "trench" may be still present subsequently to the formation of the gate dielectric layer. As such, the gate material, which is typically formed as a relatively thick layer, may refill the trench and overlay the front surface of the substrate. Alternatively stated, part of the gate material, lined by part of the gate material layer, inwardly extends into the substrate by the isolation feature, which will be discussed in further detail below. The method 100 continues to operation 120 in which a gate stack is formed over the substrate. In some embodiments, the gate stack includes patterned gate dielectric layer and gate material that extends into the substrate and protrudes from the front surface of the substrate.

In some embodiments, operations of the method 100 may be associated with cross-sectional views of a semiconductor device 200 at various fabrication stages as shown in FIGS. 2A, 2B, 2C, 2D, 2E, 2F, 2G, 2H, 2I, and 2J, respectively. In some embodiments, the semiconductor device 200 may include only one of a plurality of pixels of an image sensor device. The image sensor device 200 may be included in a microprocessor, memory cell, and/or other integrated circuit (IC). Also, FIGS. 2A through 2J are simplified for a better understanding of the concepts of the present disclosure. For example, although the figures illustrate the image sensor device 200, it is understood the IC, in which the image sensor device 200 is formed, may include any desired number of other devices comprising resistors, capacitors, inductors, fuses, etc., and other pixels that are each substantially similar to the shown pixel, which are not shown in FIGS. 2A through 2J, for purposes of clarity of illustration.

Figure 2A:
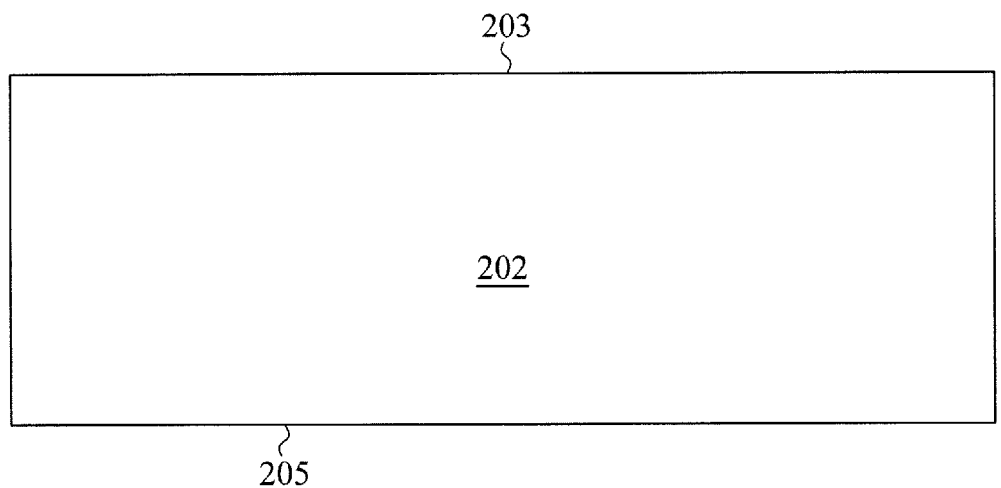
FIGS. 2A, 2B, 2C, 2D, 2E, 2F, 2G, 2H, 2I, and 2J illustrate cross-sectional views of an exemplary semiconductor device during various fabrication stages, made by the method of FIG. 1, in accordance with some embodiments.

Corresponding to operation 102 of FIG. 1, FIG. 2A is a cross-sectional view of the image sensor device 200 including a substrate 202, which is provided at one of the various stages of fabrication, according to some embodiments. As shown, the substrate 202 includes a front surface (also referred to as a front side) 203, and a back surface (also referred to as a back side) 205. The substrate 202 includes a silicon substrate doped with a first doping type of dopant (e.g., a p-type dopant) such as boron, in which case the substrate 202 is a p-type substrate. In some other embodiments, the substrate 202 may include another suitable semiconductor material. For example, the substrate 202 may be a silicon substrate that is doped with a different doping type of dopant (e.g., an n-type dopant) such as phosphorous or arsenic, in which case the substrate 202 is an n-type substrate. For purposes of consistency, the p-type dopant and n-type dopant are herein referred to as "first type of dopant" and "second type of dopant," respectively, in the following discussions. Still in some other embodiments, the substrate 202 may include other elementary semiconductors such as germanium and diamond. The substrate 202 may optionally include a compound semiconductor and/or an alloy semiconductor. Further, in some alternative embodiments, the substrate 202 may include an epitaxial layer (epi layer), may be strained for performance enhancement, and may include a silicon-on-insulator (SOI) structure.

Figure 2B:
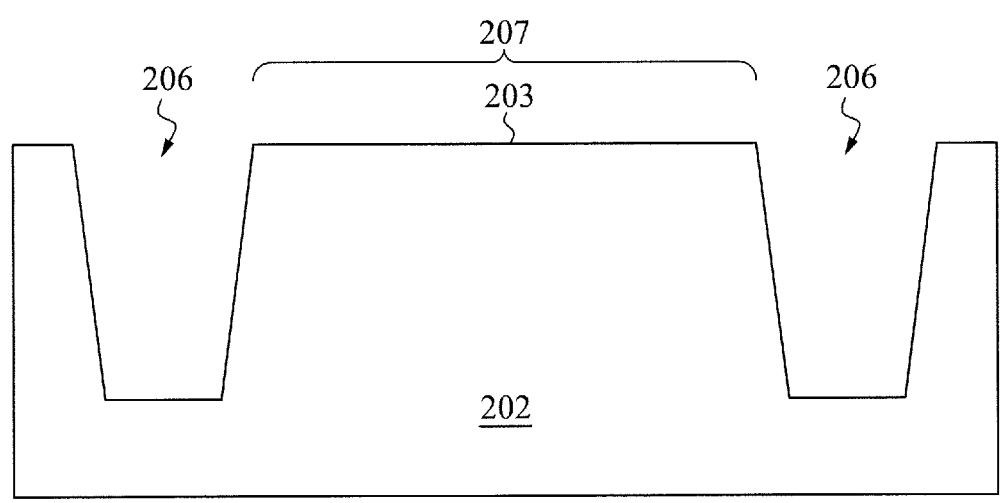

Corresponding to operation 104 of FIG. 1, FIG. 2B is a cross-sectional view of the image sensor device 200 including a recessed region 206, which is formed at one of the various stages of fabrication, according to some embodiments. As shown, the recessed region 206 is formed to extend inwardly into the substrate 202 from the front surface 203. In some embodiments, when viewing from the top, the recessed region 206 may be formed as a ring-like structure to surround an active region 207, wherein such an active region 207 may be used to form at least one pixel of the image sensor device 200, which may include at least one photodiode and one pixel transistor, as will be discussed below.

In some embodiments, the recessed region 206 may be formed by performing at least some of the following processes: using chemical vapor deposition (CVD), physical vapor deposition (PVD), spin-on coating, and/or other suitable techniques to deposit one or more removable layers (e.g., a photoresist layer, a hardmask layer, etc.) over the front surface 203 of the substrate 202; performing one or more patterning processes (e.g., a lithography process, a dry/wet etching process, a cleaning process, a soft/hard baking process, etc.) to form an opening through the one or more removable layers; using one or more (dry and/or wet) etching processes with the patterned removable layer(s) serving as a mask to recess an upper portion of the substrate 202; and removing the one or more removable layers.

Figure 2C:
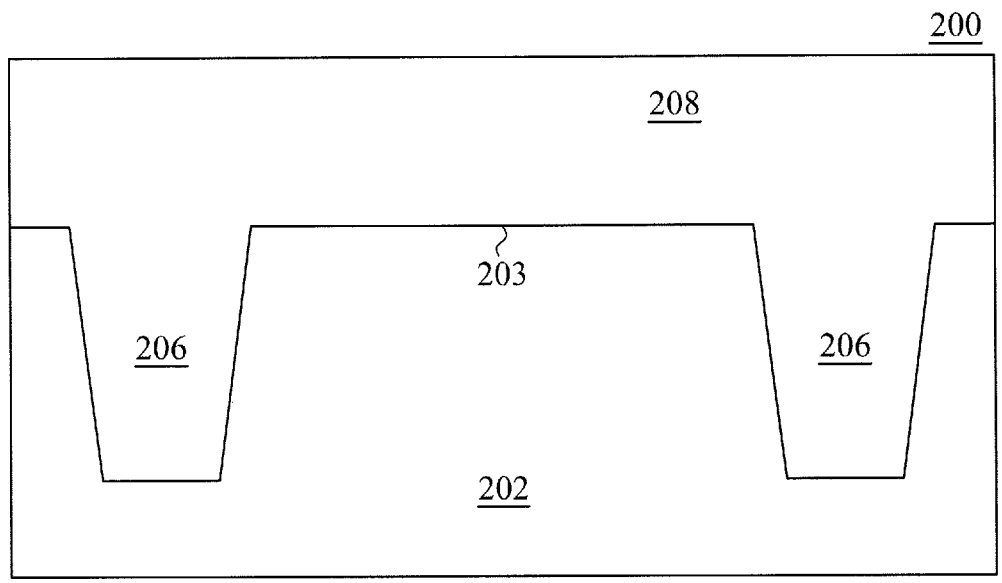

Corresponding to operation 106 of FIG. 1, FIG. 2C is a cross-sectional view of the image sensor device 200 including an isolation dielectric material 208, which is deposited at one of the various stages of fabrication, according to some embodiments. As shown, the isolation dielectric material 208 is formed to overlay the front surface 203 of substrate 202, and accordingly, fill the recessed region 206. In some embodiments, the isolation dielectric material 208 may include any of a variety of oxide materials such as, for example, silicon oxide. In some embodiments, the recessed region 206 is filled by the isolation dielectric material 208 using CVD, PVD, and/or other suitable deposition techniques to overlay the front surface 203 of substrate 202.

Figure 2D:
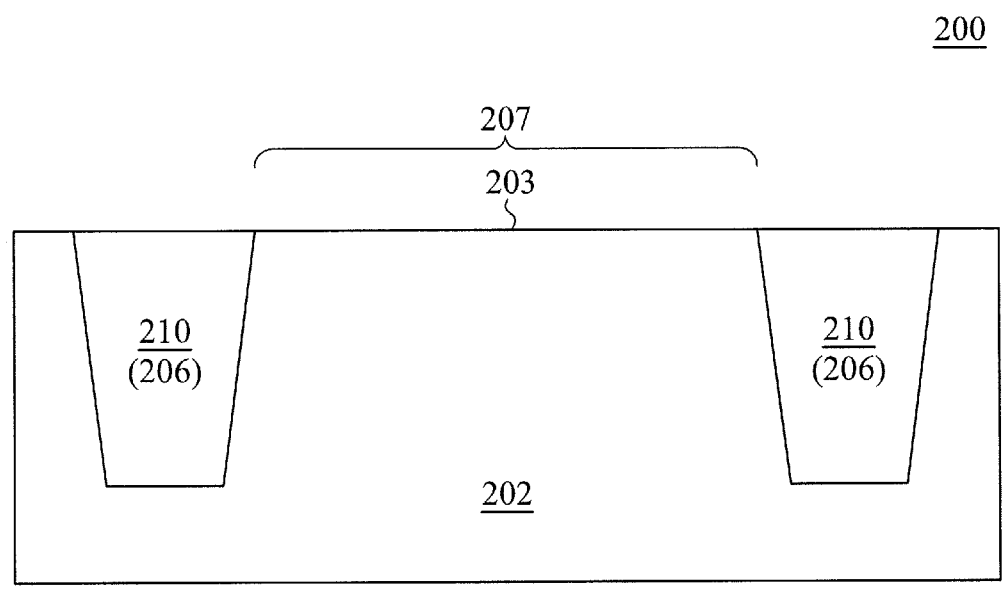

Corresponding to operation 108 of FIG. 1, FIG. 2D is a cross-sectional view of the image sensor device 200 including an isolation feature 210, which is formed at one of the various stages of fabrication, according to some embodiments. In some embodiments, the isolation feature 210 is the isolation dielectric material filling the recessed region 206. Accordingly, the isolation feature 210 may follow the same profile as the recessed region 206, i.e., the ring-like structure surrounding the active region 207. The isolation feature 210 is typically referred to as a shallow trench isolation (STI) feature. Although not shown in the illustrated embodiment of FIG. 2D (and the following figures), it is understood that one or more of other isolation features (e.g., a deep trench isolation feature) may be formed around the isolation feature 210 to further improve the isolation capability (e.g., reducing cross-talks between adjacent pixels) of the isolation feature 210 while remaining within the scope of the present disclosure. In some embodiments, the isolation feature 210 may be formed by performing a polishing process (e.g., a chemical mechanical polishing (CMP) process) on the isolation dielectric material (FIG. 2C) until the front surface 203 of the substrate 202 is re-exposed.

Figure 2E:
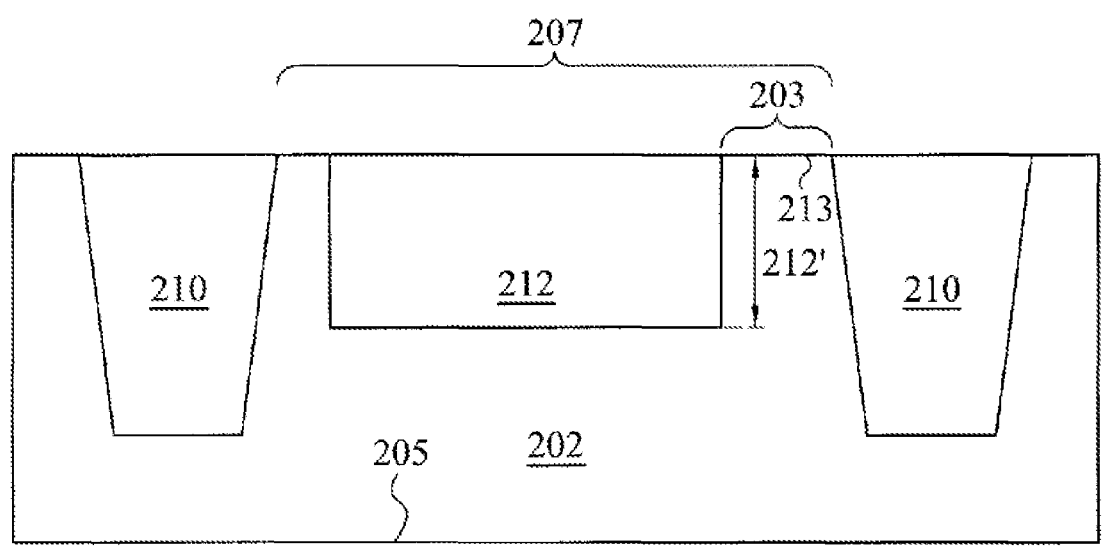

Corresponding to operation 110 of FIG. 1, FIG. 2E is a cross-sectional view of the image sensor device 200 including a first semiconductor region 212, which is formed at one of the various stages of fabrication, according to some embodiments. As shown, the first semiconductor region 212 is formed along the front surface 203 of the substrate 202 to partially overlay the substrate 202 with a portion 213 of the substrate 202 exposed, and extend inwardly into the substrate 202 from the front surface 203 by a depth 212'. In some embodiments, the first semiconductor region 212 is doped with the second doping type (n-type), which is opposite to the doping type of the substrate 202. In some alternative embodiments, the first semiconductor region 212 may be formed along the front surface 203 of the substrate 202 to completely overlay the substrate 202 (i.e., no such an exposed portion 213 exists).

In some embodiments, the first semiconductor region 212 may be formed by at least some of the following processes: using chemical vapor deposition (CVD), physical vapor deposition (PVD), spin-on coating, and/or other suitable techniques to deposit a removable layer (e.g., a photoresist layer, a hardmask layer, etc.) over the substrate 202; performing one or more patterning processes (e.g., a lithography process, a dry/wet etching process, a cleaning process, a soft/hard baking process, etc.) to form an opening through the removable layer, wherein the opening is surrounded by the isolation feature 210; with the patterned removable layer serving as a mask, performing a doping process (e.g., an ion implantation process, a diffusion process, etc.) to incorporate a plurality of dopants with the second doping type (n-type) into the substrate 202; removing the removable layer; and performing an optional annealing process to activate the incorporated dopants.

Figure 2F:
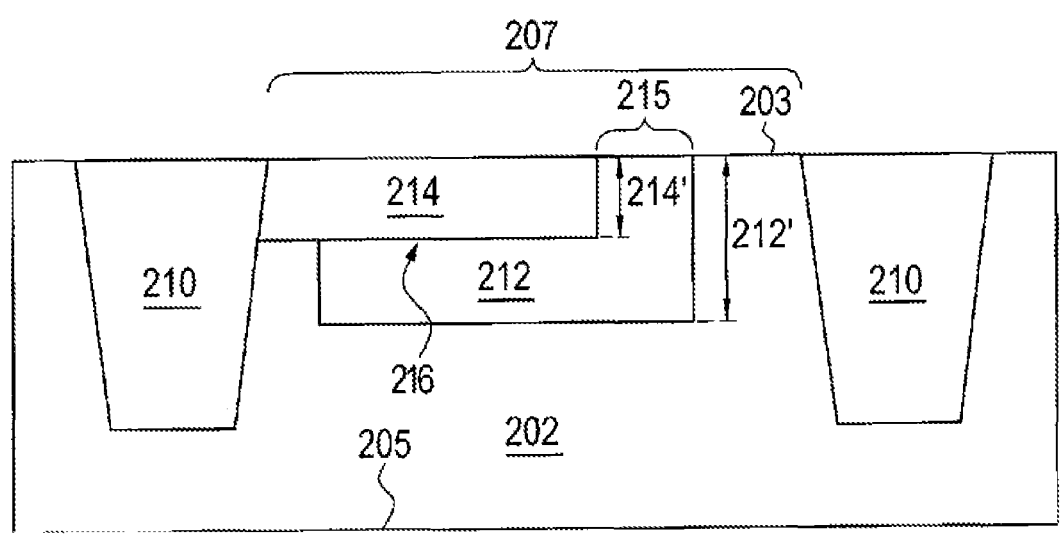

Corresponding to operation 112 of FIG. 1, FIG. 2F is a cross-sectional view of the image sensor device 200 including a second semiconductor region 214, which is formed at one of the various stages of fabrication, according to some embodiments. As shown, the second semiconductor region 214 is formed along the front surface 203 of the substrate 202 to partially overlay the first semiconductor region 212 with a portion 215 of the first semiconductor region 212 exposed, and extend inwardly into the first semiconductor region 212 by a depth 214' that is shallower than the depth 212' of the first semiconductor region 212.

In some embodiments, similar to the substrate 202, the second semiconductor region 214 is also doped with the first doping type (p-type) but in an elevated concentration. As such, a p-n junction 216 may be formed at the interface between the first semiconductor region 212 and the second semiconductor region 214, and in some embodiments, the first semiconductor region 212 and the second semiconductor region 214 (with the p-n junction 216) may function as a photodiode of the pixel surrounded by the isolation feature 210. Employed by the present disclosure, such a photodiode may be configured to convert an radiation source (e.g., light), incident from either the front surface 203 or the back surface 205, into an electrical current signal, which will be discussed in further detail below. Further, at least partially due to the elevated doping concentration, the second semiconductor region 214, which is typically referred to as a "pinned layer," may be configured to provide an isolation feature to the first semiconductor region 212, according to some embodiments.

In some embodiments, the second semiconductor region 214 may be formed by at least some of the following processes: using chemical vapor deposition (CVD), physical vapor deposition (PVD), spin-on coating, and/or other suitable techniques to deposit a removable layer (e.g., a photoresist layer, a hardmask layer, etc.) over the substrate 202; performing one or more patterning processes (e.g., a lithography process, a dry/wet etching process, a cleaning process, a soft/hard baking process, etc.) to form an opening through the removable layer, wherein the opening is aligned with the first semiconductor region 212 (e.g., laterally confined within the area defined by the first semiconductor region 212); with the patterned removable layer serving as a mask, performing a doping process (e.g., an ion implantation process, a diffusion process, etc.) to incorporate a plurality of dopants with the first doping type (p-type) into the first semiconductor region 212; removing the removable layer; and performing an optional annealing process to activate the incorporated dopants.

Figure 2G:
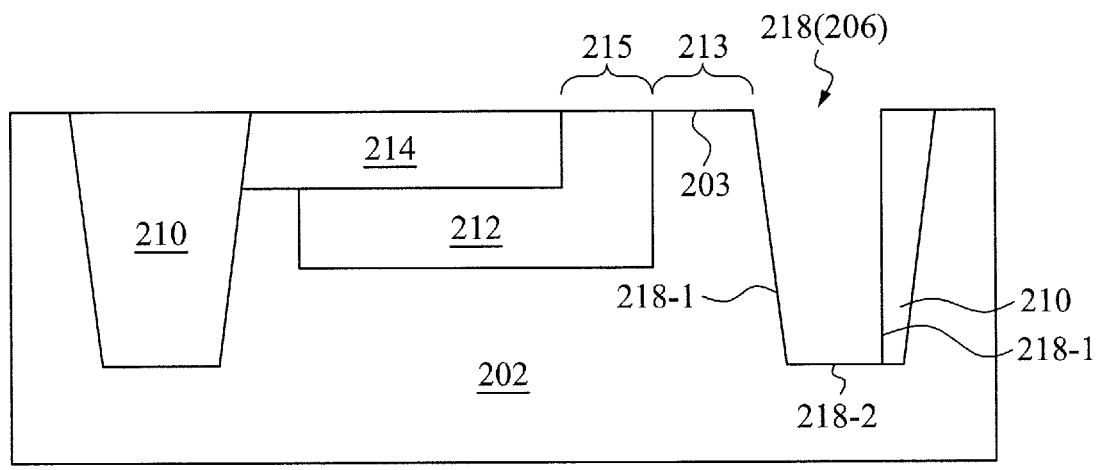

Corresponding to operation 114 of FIG. 1, FIG. 2G is a cross-sectional view of the image sensor device 200 in which a portion of the isolation feature 210 is recessed at one of the various stages of fabrication, according to some embodiments. As shown in the illustrated embodiment of FIG. 2G (and the following figures), the recessed portion of the isolation feature 210 is laterally adjacent the exposed portion 213 of the front surface 203, which forms a trench 218 laterally adjacent the exposed portion 213 of the front surface 203. It is noted that the trench 218 is part of the recessed region 206 (FIG. 2B). More specifically, in some embodiments, after the formation of the trench 218, at least respective upper portions of sidewalls of the recessed region 206 (also sidewalls 218-1 of the trench 218) and/or at least a portion of a bottom boundary of the recessed region 206 (also a bottom boundary of the trench 218) are respectively re-exposed.

In some embodiments, the trench 218 may be formed by performing at least some of the following processes: using chemical vapor deposition (CVD), physical vapor deposition (PVD), spin-on coating, and/or other suitable techniques to deposit one or more removable layers (e.g., a photoresist layer, a hardmask layer, etc.) over the front surface 203 of the substrate 202; performing one or more patterning processes (e.g., a lithography process, a dry/wet etching process, a cleaning process, a soft/hard baking process, etc.) to form an opening through the one or more removable layers, wherein the opening is aligned with an area where the trench 218 is to be formed; using one or more (dry and/or wet) etching processes with the patterned removable layer(s) serving as a mask to recess a portion of the isolation feature 210; and removing the one or more removable layers.

Figure 2H:
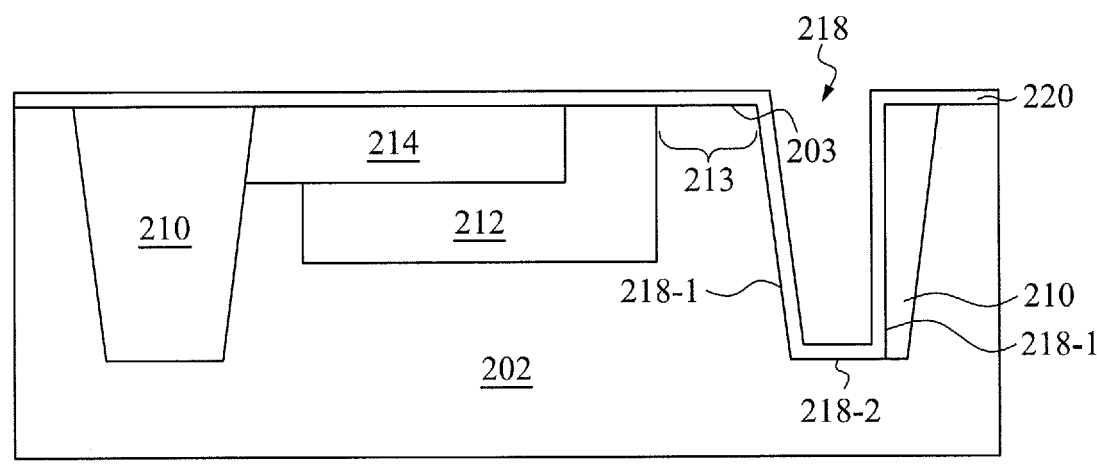

Corresponding to operation 116 of FIG. 1, FIG. 2H is a cross-sectional view of the image sensor device 200 including a gate dielectric layer 220, which is formed at one of the various stages of fabrication, according to some embodiments. As shown, the gate dielectric layer 220 is formed to overlay the substrate 202. More specifically, the gate dielectric layer 220 overlays the isolation feature 210, the first and second semiconductor regions 212 and 214, the exposed portion 213 of the front surface 203 of the substrate 202, and the trench 218. In some embodiments, since the gate dielectric layer 220 is substantially thin and conformal, the gate dielectric layer 220 may be formed to line the trench 218, i.e., extending along the sidewalls 218-1 and the bottom boundary 218-2, while not fully filling the trench 218.

In some embodiments, the gate dielectric layer 220 is formed of a high dielectric constant (hereinafter "high-k" or "HK") material. The high-k material may include a metal oxide, a metal nitride, a metal silicate, a transition metal-oxide, a transition metal-nitride, a transition metal-silicate, an oxynitride of metals, a metal aluminate, a zirconium silicate, a zirconium aluminate, combinations thereof, or other suitable compositions. Exemplary high-k materials further include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials. Alternatively, the high-k materials may include other high-k dielectrics such as LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, $(Ba,Sr)TiO_3$ (BST), $Al_2O_3$, $Si_3N_4$, and/or other suitable materials. Although described herein as an embodiment including high-k materials, other dielectric materials (e.g., $SiO_2$) are possible and within the scope of the disclosure. In some embodiments, the gate dielectric layer 220 may be formed by using an atomic layer deposition (ALD), CVD, or PVD technique to deposit at least one of the above-mentioned dielectric material over the substrate 202.

Figure 2I:
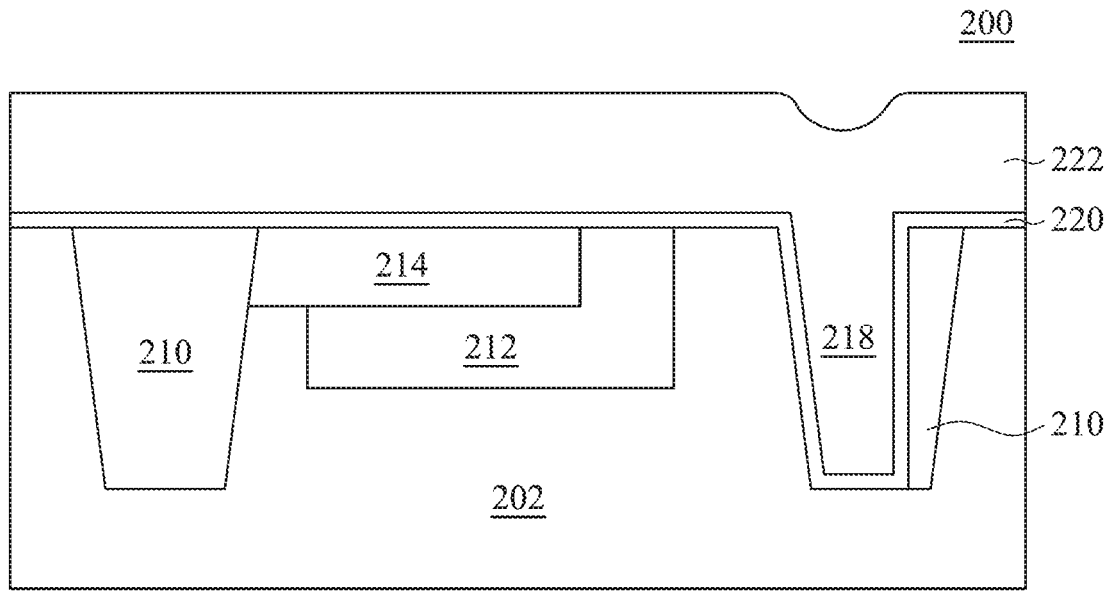

Corresponding to operation 118 of FIG. 1, FIG. 2I is a cross-sectional view of the image sensor device 200 including a gate material 222, which is formed at one of the various stages of fabrication, according to some embodiments. As shown, the gate material 222 overlays the substrate 202, and since the gate material 222 is formed to be substantially thick, the trench 218 is refilled with the gate material 222. According to some embodiments, the gate material 222, which includes a polysilicon material, for example, may be formed by using a CVD, or PVD technique to deposit the polysilicon over the substrate 202.

Figure 2J:
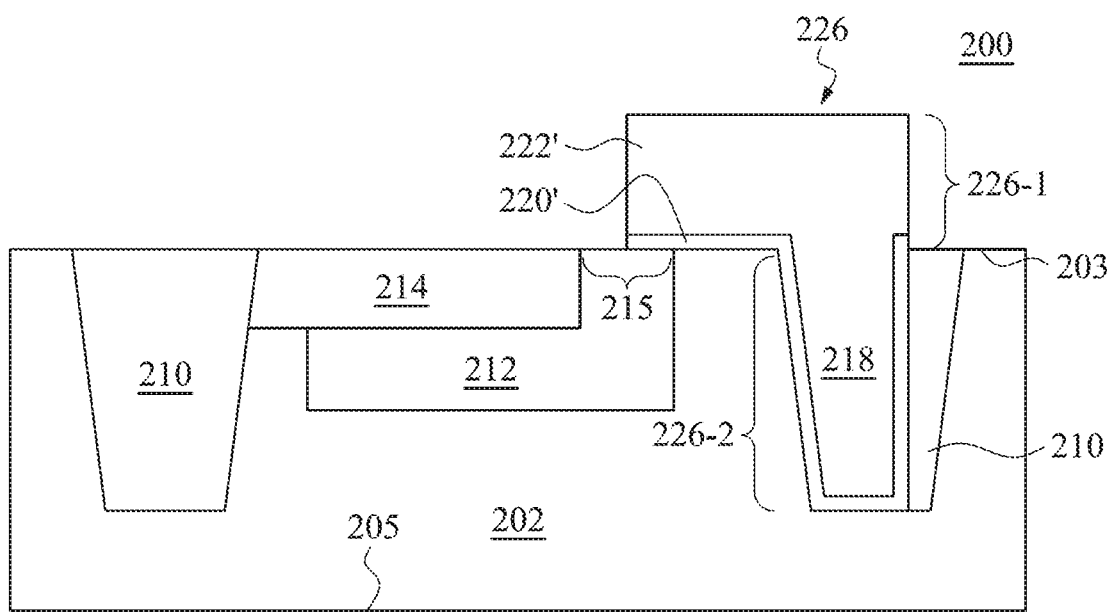

Corresponding to operation 120 of FIG. 1, FIG. 2J is a cross-sectional view of the image sensor device 200 including a gate stack 226, which is formed at one of the various stages of fabrication, according to some embodiments. According to some embodiments, the gate stack 226 includes a patterned gate dielectric layer 220' and a patterned gate material 222'. In the illustrated embodiment of FIG. 2J, the gate stack 226 includes at least two portions: a first portion 226-1 laterally extending along the front surface 203 of the substrate 202; and a second portion 226-2 inwardly extending into the substrate 202 from the front surface 203. Further, in some embodiments, the first portion 226-1 laterally extends along the front surface 203 of the substrate 202 to at least partially overlay the portion 215 of the first semiconductor region 212.

In some embodiments, the gate stack 226 may be formed by performing at least some of the following processes: using chemical vapor deposition (CVD), physical vapor deposition (PVD), spin-on coating, and/or other suitable techniques to deposit one or more removable layers (e.g., a photoresist layer, a hardmask layer, etc.) over the gate material 222; performing one or more patterning processes (e.g., a lithography process, a dry/wet etching process, a cleaning process, a soft/hard baking process, etc.) to form an opening through the one or more removable layers, wherein the opening is aligned with an area where the gate stack 226 is not to be formed; using one or more (dry and/or wet) etching processes with the patterned removable layer(s) serving as a mask to recess respective portions of the gate material 222 and the gate dielectric layer 220; and removing the one or more removable layers.

As mentioned above, the first and second semiconductor regions 212 and 214 form the photodiode of the pixel surrounded by the isolation feature 210. In some embodiments, the gate stack 226 may be formed as a "transfer gate" of a transfer transistor of the pixel. In operation, the photodiode first absorbs a radiation source, incident from either the front surface 203 or the back surface 205, and converts the radiation source into a plurality of electron-hole pairs in the first semiconductor region 212 (e.g., close to the portion 215). Then, in some embodiments, the gate stack 226 is configured to serve as a gate to control (modulate) a "flow" of the generated electron-hole pairs (i.e., an electrical current signal) into a floating diffusion region (not shown in the cross-sectional view of FIG. 2J). Such a diffusion region is further coupled to one or more other transistors (e.g., a reset transistor, a source follower transistor, a selector transistor, etc.) of the pixel to allow the one or more other transistors to further process the generated electrical current signal.

In the conventional image sensor device, the above-described gate stack of the transfer transistor is typically formed to extend only along the front surface 203 (i.e., no second portion 226-2). Various issues may be induced when forming the gate stack of the transfer transistor in such a completely lateral configuration. For example, because the gate stack of the transfer transistor in each of a plurality of pixels of the conventional image sensor device extends only along a single direction, the above-mentioned floating diffusion region can be only formed along that single direction. As such, respective pitches, across a given distance along the direction, that are available to form the photodiodes over the plurality of pixels are significantly limited. Accordingly, an "area" available to form the photodiodes are reduced, which disadvantageously lowers the fill factor, in turn, deteriorating the performance of the conventional image sensor devices.

Figure 3:
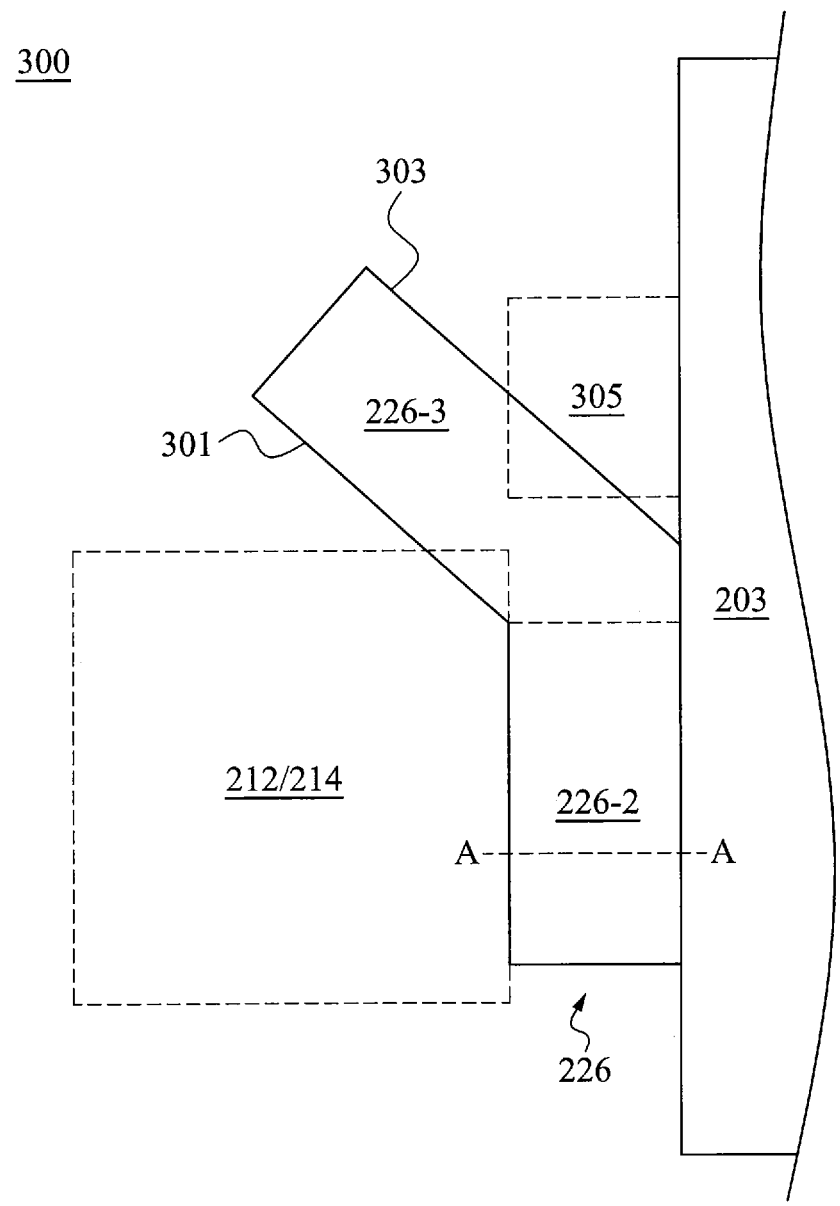
FIG. 3 illustrates an exemplary top view of an exemplary semiconductor device made by the method of FIG. 1, in accordance with some embodiments.

FIG. 3 illustrates an exemplary top view 300 of the image sensor device 200, in accordance with various embodiments. It is noted that the cross-sectional views shown throughs FIGS. 2A-2J are each taken along line A-A of the top view 300. Accordingly, in addition to the first and second portions 226-1 and 226-2 as shown in FIG. 2J, the gate stack 226 may further include a portion 226-3 laterally extended from the first portion 226-1, and specifically, tilted from the first portion 226-1. In some embodiments, such a tilted portion 226-3 may be disposed above the front surface 203 (FIG. 2J), i.e., not extending into the substrate 202, which allows the photodiode (formed by the first and second semiconductor regions 212 and 214) to be disposed on one side 301 of the tilted portion 226-3 and the above-described floating diffusion region (305 in the illustrated embodiment of FIG. 3) to be disposed on another side 303, opposite to the side 301, of the tilted portion 226-3. As such, additional distances along the line A-A can be spared, which can significantly increase the respective pitches that are available to form the photodiodes over the plurality of pixels of the disclosed image sensor device 200. Thus, compared to the conventional image sensor devices, the performance of the disclosed image sensor device 200 can be advantageously enhanced.

In an embodiment, a semiconductor device includes: a photodiode formed in a substrate; and at least one transistor having a gate feature that at least partially extends from a major surface of the substrate into the substrate, wherein the photodiode and the at least one transistor at least partially form a pixel.

In another embodiment, a semiconductor device includes: a photodiode formed in a substrate; and at least one transistor having a gate feature that comprises a first portion and a second portion coupled to an end of the first portion, the first portion disposed above and extending along a major surface of the substrate and the second portion extending from the major surface of the substrate into the substrate, wherein the photodiode and the at least one transistor at least partially form a pixel.

In yet another embodiment, a method includes: forming an isolation feature extending into a substrate; forming a first semiconductor region and a second semiconductor region in the substrate that is surrounded by the isolation feature; recessing a portion of the isolation feature to expose a sidewall of the isolation feature facing but laterally spaced apart from the first and second semiconductor regions; and forming a gate feature that extends along a major surface of the substrate and fills the recessed portion of the isolation feature.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a photodiode formed in a substrate having a first semiconductor region in the substrate doped with a first concentration of a first dopant type and a second semiconductor region disposed over the first semiconductor region and doped with a second concentration of the first dopant type, the second concentration being higher than the first concentration;
at least one transistor having a gate feature that at least partially extends from a major surface of the substrate into the substrate; and
a pixel comprising the photodiode and the at least one transistor.

2. The semiconductor device of claim 1, wherein the first dopant type comprises a p-type dopant.

3. The semiconductor device of claim 1, wherein the gate feature of the at least one transistor comprises a first portion that extends above the major surface of the substrate and a second portion that extends into from the major surface of the substrate into the substrate.

4. The semiconductor device of claim 3, wherein the first portion of the gate feature of the at least one transistor is laterally coupled to the first semiconductor region, and the second portion of the gate feature of the at least one transistor is laterally spaced apart from the first semiconductor region.

5. The semiconductor device of claim 1, wherein the gate feature of the at least one transistor comprises a gate oxide layer and a polysilicon layer that each comprises a lateral portion extending along the major surface of the substrate and a vertical portion extending into the substrate.

6. The semiconductor device of claim 1, wherein the at least one transistor is a transfer gate transistor of the pixel.

7. The semiconductor device of claim 1, further comprising:
an isolation feature, extending into the substrate, that surrounds the photodiode and the at least one transistor.

8. A semiconductor device, comprising:
a photodiode formed in a substrate;
at least one transistor having a gate feature that comprises a first portion and a second portion coupled to an end of the first portion, the first portion disposed above and extending along a major surface of the substrate forming an obtuse angle with the second portion and the second portion extending from the major surface of the substrate into the substrate; and
a pixel comprising the photodiode and the at least one transistor.

9. The semiconductor device of claim 8, wherein the photodiode comprises:
a first semiconductor region in the substrate that is doped with a first doping type; and
a second semiconductor region over the first semiconductor region that is doped with a second doping type.

10. The semiconductor device of claim 9, wherein the first and second doping types are different from each other.

11. The semiconductor device of claim 9, wherein the first portion of the gate feature of the at least one transistor is laterally coupled to the first semiconductor region, and the second portion of the gate feature of the at least one transistor is laterally spaced apart from the first semiconductor region.

12. The semiconductor device of claim 8, wherein the gate feature of the at least one transistor comprises a gate oxide layer and a polysilicon layer that each comprises a lateral portion extending along the major surface of the substrate and a vertical portion extending into the substrate.

13. The semiconductor device of claim 9, wherein the at least one transistor is a transfer gate transistor of the pixel.

14. The semiconductor device of claim 10, further comprising:
an isolation feature, extending into the substrate, that surrounds the photodiode and the at least one transistor.

15. The semiconductor device of claim 14, wherein at least a portion of the isolation feature directly contact the second portion of the gate feature of the at least one transistor.

16. A semiconductor device, comprising:
a photodiode formed in a substrate; and
at least one transistor having a gate feature that comprises a first portion and a second portion coupled to an end of the first portion, the first portion disposed above and extending along a major surface of the substrate and forming an obtuse angle with the second portion and the second portion partially extending from the major surface of the substrate into the substrate.

17. The semiconductor device of claim 16, further comprising a pixel comprising the photodiode and the at least one transistor.

18. The semiconductor device of claim 16, wherein the photodiode comprises:
a first semiconductor region in the substrate that is doped with a first doping type; and
a second semiconductor region over the first semiconductor region that is doped with a second doping type.

19. The semiconductor device of claim 18, wherein:
the first and second doping types are different from each other;
the gate feature of the at least one transistor comprises a first portion that extends above the major surface of the substrate and a second portion that extends from the major surface of the substrate into the substrate.

20. The semiconductor device of claim 16, wherein the photodiode comprises:
a first semiconductor region in the substrate that is doped with a first doping type; and
a second semiconductor region over the first semiconductor region that is doped in an elevated concentration with the first doping type.

21. The semiconductor device of claim 18, wherein a first depth of the first semiconductor region is less than a second depth of second semiconductor region.

* * * * *